United States Patent
Vora et al.

(10) Patent No.: US 6,385,563 B1
(45) Date of Patent: May 7, 2002

(54) REUSABLE DESIGN MODEL AND APPARATUS

(75) Inventors: Rahul Vora, Portland; Robert E. Zundel, Wilsonville, both of OR (US)

(73) Assignee: Autodesk, Inc., San Rafael, CA (US)

(*) Notice: Subject to any disclaimer, the term of this patent is extended or adjusted under 35 U.S.C. 154(b) by 0 days.

(21) Appl. No.: 09/189,425

(22) Filed: Nov. 10, 1998

(51) Int. Cl.$^7$ .................................................. G06G 7/48
(52) U.S. Cl. ............................................................ 703/6
(58) Field of Search ............................................ 703/6

(56) References Cited

U.S. PATENT DOCUMENTS

| | | | | |
|---|---|---|---|---|
| 4,912,657 A | * | 3/1990 | Saxton et al. | 345/356 |
| 5,586,052 A | * | 12/1996 | Iannuzzi et al. | 703/1 |
| 5,771,342 A | * | 6/1998 | Todd | 345/439 |
| 5,835,693 A | * | 11/1998 | Lynch et al. | 345/473 |
| 5,980,084 A | * | 11/1999 | Jones et al. | 700/95 |
| 6,063,126 A | * | 5/2000 | Borduin | 703/2 |

OTHER PUBLICATIONS

Snyder; "An interactive tool for placing curved surfaces without interpenetration", Proc. 22nd ACM Conf. Computer Graphics; pp. 209–218, Aug. 1995.*

Lin et al.; "A contraint–driven solid modeling open environment"; 2nd ACM Solid Modeling Conf.; pp. 233–242, May 1993.*

Fa et al.; "Interactive constraint–based modeling using allowable motion"; 2nd ACM Modeling Conf.; pp. 243–252, May 1993.*

Bruderlin; "Constructing three–dimensional geometric objects defined by constraints"; 1986 workshop on Interactive 3D Graphics; pp. 111–129, Oct. 1986.*

Shih et al.; "A design/constraint model to capture design intent"; Solid Modeling '97; pp. 255–264, Jul. 1997.*

Middleditch et al.; "A kernel for geometric features"; Solid Modeling '97; pp. 131–140, Jul. 1997.*

Hsu et al.; "A constraint–based manipulator toolset for editing 3D objects"; Solid Modeling '97; pp. 168–180, Jul. 1997.*

Marian Bozdoc, "The History of CAD", 2000–2001, Auckland, NZ, http://www.bozdoc.f2s.com/CAD–History.

* cited by examiner

Primary Examiner—Kevin J. Teska
Assistant Examiner—Hugh Jones
(74) Attorney, Agent, or Firm—Wilson, Sonsini, Goodrich & Rosati

(57) ABSTRACT

A reusable model of a three-dimensional object is created on a computer system. The reusable model includes model objects and internal constraints on the model objects. The internal constraints maintain the structure of the reusable model with respect to the three-dimensional object. The reusable model can have inputs that accept directed and non-directed external constraints with models using the reusable model. The inputs define the direct methods for modifying the structure of the reusable model. The reusable model can have outputs that have directed constraints with models using the reusable model. The outputs provide a direct method for using the structure of the reusable model to modify the structure of the model using the reusable model. Nondirected constraints may be associated between the model using the reusable model and the reusable model to position the reusable model in the model.

12 Claims, 3 Drawing Sheets

REUSABLE DESIGN MODEL AND APPARATUS

COPYRIGHT NOTICE

A portion of the disclosure of this patent document contains materials that are subject to copyright protection. The copyright owner has no objection to the facsimile reproduction by anyone of the patent disclosure, as it appears in the Patent and Trademark Office patents, files or records, but otherwise reserves all copyright rights whatsoever.

BACKGROUND OF THE INVENTION

1. Field of the Invention

This invention relates to the field of computer aided design models and more specifically the invention relates to the field of component reuse in design models.

2. Description of the Related Art

Computers can be used by people to model physical objects by using modeling applications (also referred to as computer aided design (CAD) software). CAD software allows users to build models on their computers that represent physical objects. CAD software allows users to define models in terms of model objects and constraints. If a model object is constrained so that its location and dimensions are defined in relation to other model objects, the CAD software can solve the constraints as model objects are modified (e.g. moved, scaled, reoriented) to simplify the design process. Constraint satisfaction is the process of finding locations, dimensions, colors, speed, temperatures, etc., for model objects in accordance with the constraints specified in the model.

Sophisticated constraint satisfaction tools have been developed along with simulation tools that permit the development of entire complex systems such as airplanes and automobiles with CAD software. Greater design flexibility can grow out of the ability to reuse components. Thus, when designing a tall building, a reusable steel girder component would eliminate the need to tediously model each girder separately. The usefulness of reusable components is directly related to the amount of problem domain specific knowledge incorporated into the component. For example, if the steel girder component is capable of computing its load bearing capacity, that will be more useful than a similar component that does not provide that information.

Traditionally, CAD software packages came with a limited number of primitive shapes and a limited number of operations that operated on those primitive shapes. For example, systems such as PADL (University of Rochester), Romulus (Shape Data, Ltd.), and CV CADDS Computervision provide Boolean operations to combine shapes. The shapes could either be primitives or the results of earlier operations. The primitives typically include cylinders, cones, spheres, tori, rectangular blocks, and triangular prisms. The natural parameters of length, height, radius, etc., parameterize the dimensions of the primitives.

More recent systems such as Pro-Engineer (Parametric Technologies), Solid Works (Dassault), and Solid Edge (Intergraph) provide more advanced operations capable of working on general three-dimensional shapes. Nonetheless, the operations are limited to those provided by the system. All other shapes are composed from these operations and these other shapes are treated by the design system as separate primitives combined by operations rather than as coherent pieces of design.

Thus, if a user wanted to create reusable parts, programming knowledge was necessary to create add-on modules that provided domain specific solutions. These add-on modules are typically limited in several ways. The most basic limitation was that the add-on components could not work with the built in operations unless significant programming took place. This is a severe limitation on the usefulness of the add-on components. Additionally, there was only limited ability for the add-on components to be parameterized by the end-user. Thus, a user might have been able to alter the length of a steel girder created by an add-on module, but not other parameters. Additionally, this prevents the users with problem domain specific knowledge from easily creating add-on modules. For example, a company that specializes in the development of structural steel members such as I-beams and joints is likely to have significant problem domain specific knowledge. Such knowledge might encompass information about the types of connection plates used to join the structural members as well as information about the patterns of holes used at joints. Unfortunately, if that user does not have significant programming skill, then she or he would be unable to create an add-on module to encapsulate the problem domain specific knowledge.

The add-on module structure is also not conducive to the use of constraint satisfaction to solve models. By defining a model with constraints, the model is more easily modified. It is therefore also desirable to allow the user to provide constraint satisfaction tools that may not be part of the CAD software. If those user-supplied constraint satisfaction tools need to work with add-on module components, additional programming will be required that will enable the user-supplied constraint satisfaction tool to work with the add-on module component. This defeats the ability of the user to freely work with a variety of constraint satisfaction tools and add-on modules.

Previous CAD software allowed users to group related model objects and then copy and paste them for reuse. This technique is limited in its usefulness because the model database quickly becomes extremely large because the grouped model objects are actually composed of many individual model objects. This technique is also limited because the grouped model objects are not easily parameterized or scaled. Scaling grouped model objects requires direct modification of each of the underlying model objects by exploding the group to its component model objects. This is tedious and is not conducive to third-party development of reusable design components because the entire structure of the grouped model object is available to the user.

Previous approaches to permitting reusable design components have failed to permit creation of reusable design components without significant programming effort. Previous approaches to permitting reusable design components have not allowed extensive parameterization of the reusable design components. Previous approaches to permitting reusable design components have not supported sophisticated constraint satisfaction model construction techniques. Accordingly, what is needed is a system for creating reusable design components that permits easy construction of reusable design components by the possessors of problem domain specific knowledge that are easily constrained and parameterized by the end-user.

SUMMARY OF THE INVENTION

A reusable model of a three-dimensional object supporting reuse in computer modeling systems is described. A reusable model is a model of a three-dimensional object. The three-dimensional object could be a steel I-beam, a screw, a bolt, a pipe, a battery compartment, a gear, or any three-dimensional object. Once created, the reusable model can be stored and reused in other models on the computer modeling systems.

The reusable model is constructed from model objects that define the structure of the reusable model. For example, a steel I-beam could be constructed out of model objects for the extrusions, fillets, and rounds that make up the beam.

Constraints define relationships between model objects. Constraints can simplify the design of complex models by eliminating the need to specifically define the position and orientation of each model object. For example, a model object can be constrained to be parallel to another model object.

Internal constraints can be defined between the model objects that comprise the reusable model. The internal constraints maintain the structure of the reusable model with respect to the three-dimensional object. For example, the internal constraints on a steel I-beam might ensure that the beam remains straight and that the web face remained centered. Additionally, internal constraints might limit the orientations that the I-beam can be placed in. The internal constraints serve to enforce the I-beam nature of the reusable model.

It is possible to define inputs to the reusable model. The inputs allow the reusable model to be parameterized. For example, a steel I-beam might have a length input, a height input, and a bending moment capacity input. Further, the inputs to the reusable model can be constrained by either directed or non-directed constraints with model objects in the model the reusable model is being used in. For example, a constraint could be defined between a connection plate in a model of a building and a steel I-beam reusable model that affected the input parameter of length. In one embodiment, the inputs can have default values assigned. In one embodiment, the inputs can have maximum and minimum values. In another embodiment, the inputs can be limited to a set of discrete values. For example, a steel I-beam reusable model might have a default length input of 10 meters, a minimum length of 5 meters, and a maximum length of 40 meters. For example, the bending moment capacity input might be limited to a set of standard values. These values may be based on physical limitations, manufacturing limitations or common usage.

It is possible to define outputs from the reusable model. The outputs allow the structure of the reusable model to be used to define the structure of the model using the reusable model. For example, a bolt reusable model might have an output of the thread diameter. The thread diameter output could be used to define other objects, for example the size of the opening on the matching hole. The outputs of the reusable model can be used to create any directed constraints with model objects in the model using the reusable model.

Any aspect of the reusable model may accept nondirected constraints with the model using the reusable model. For example, even though the web face of a steel I-beam reusable model might be neither an input nor an output, a nondirected constraint could require that its plane be parallel with a model object in a model using the I-beam.

In one embodiment, the model using the reusable model can be solved so that all the constraints are fully satisfied. In this process, the internal constraints of the reusable model are preserved. If it is not possible to solve the external constraints while maintaining the internal constraints, an error is reported.

In one embodiment, a reusable model can be comprised of other reusable models.

In one embodiment, a pictorial representation of the reusable model is created using predefined values for the inputs. This allows a collection of reusable models to be stored with the pictorial representations to allow for easy selection of the appropriate reusable model.

DETAILED DESCRIPTION

A. System Overview

Figure 1:
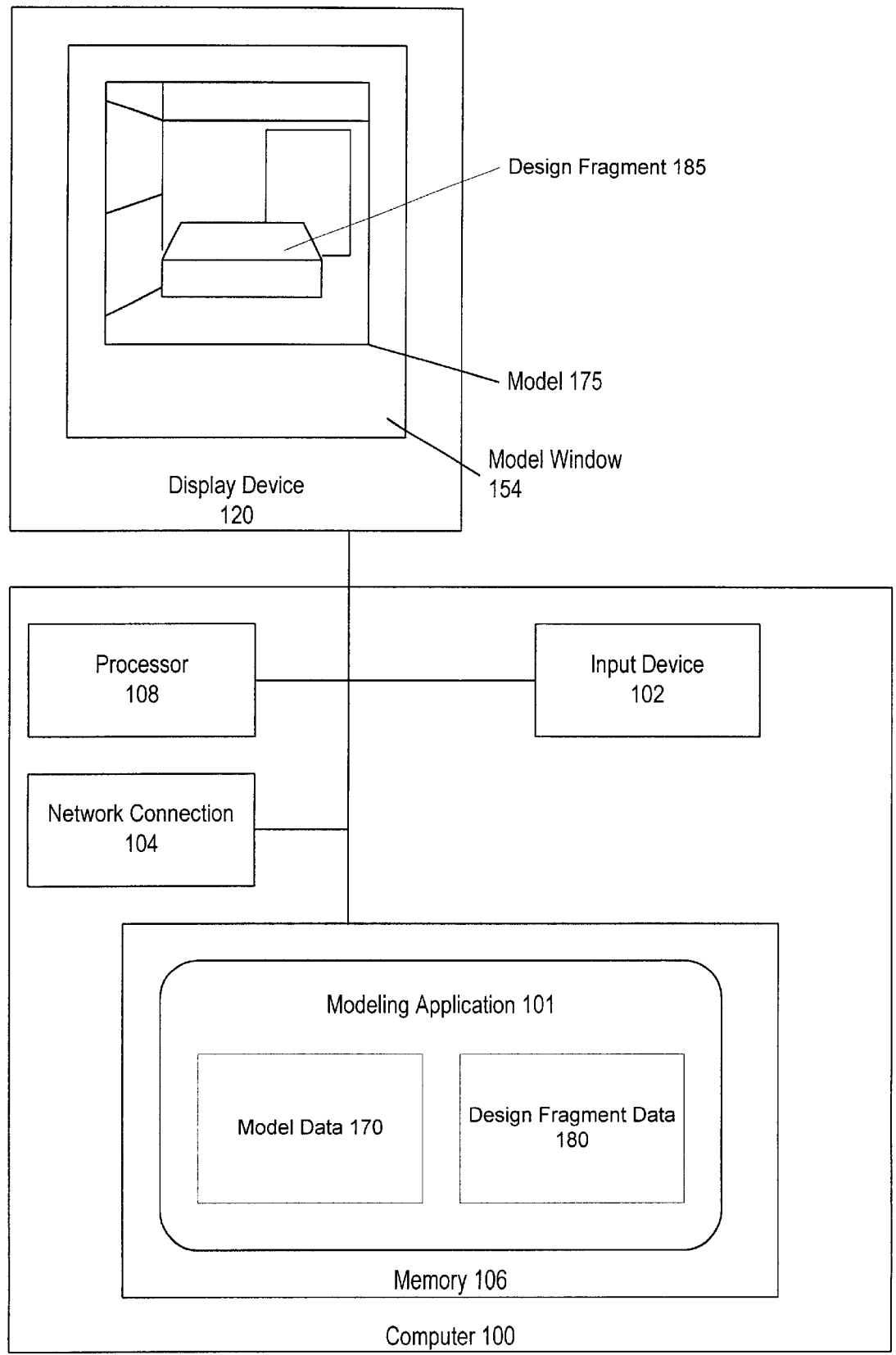
FIG. 1 illustrates a computer system including one embodiment of the invention.

FIG. 1 depicts a computer system including an embodiment of the invention. The computer system is running a modeling application that is used to define a three-dimensional model of an object. The modeling application supports reusable design components that can be created and manipulated by the user.

This paragraph lists the elements in FIG. 1. FIG. 1 includes a computer 100 comprising an input device 102, a network connection 104, a memory 106, and a processor 108. The memory 106 comprises a modeling application 101, a model data 170, and a design fragment data 180. FIG. 1 includes a model 175 that is displayed in a model window 154 on a display device 120. The model 175 includes a design fragment 185.

This paragraph describes the interconnections between the elements of FIG. 1. The computer 100 is coupled to the display device 120. The input device 102, the network connection 104, the memory 106, and the processor 108 are coupled to a bus within the computer 100.

The computer 100 may be a personal computer or a more powerful workstation computer. The computer 100 is controlled by the processor 108. The processor 108 can be either a single processor or multiple processors coupled to the memory 106. The processor 108 executes programs on the computer 100 and displays results to the user on the display device 120. The input device 102 allows input to the computer 100. The input device 102 may be a mouse, other pointing device, and/or a keyboard that allows a user to control the system and interact with the model 175. The display device 120 may be a CRT or other display device. The display device 120 is used to present a two-dimensional representation of the model 175 to the user. The model 175 is presented to the user inside the model window 154 on the display device 120. The network connection 104 allows the computer 100 to be connected to a network. The modeling application 101 can be stored in the memory 106 or distributed across the network for access via the network connection 104. In this example, the modeling application 101 is contained in the memory 106. Additionally, the model data 170 and the design fragment data 180 are stored in the memory 106.

The modeling application 101 permits the user to model physical objects such as buildings, machines, semiconductors, automobiles, planes, etc. In this example, the model 175 shows a kitchen in the early stages of design. The modeling application 101 enables the user to define the model 175. The modeling application 101 uses the model data 170 stored in the memory 106 to represent the model 175. Model 175 is comprised of model objects and constraints. Constraints are relationships between model objects. For example, a constraint might be that two model objects must be parallel to one another.

There are two basic types of constraints: directed constraints and non-directed constraints. Directed constraints, also called unidirectional constraints, are constraints that cause a deterministic output from a predetermined set of model objects. The cause and effect relationship is specific to the constraint's definition and is known without reference to other model objects. For example, boolean intersection constraint applied to a sphere and a cube produces a new model object. Non-directed constraints, also called bidirectional or multidirectional constraints, are those constraints that specify a condition to be met without inherently specifying a cause and effect relationship and that require additional context to fully define the model. This additional context is typically provided by other non-directed constraints during a simultaneous solution approach in a particular solver program such as those used by the graph based approach developed by Scott M. Borduin. For example, a constraint that two lines be parallel to one another is non-directed because the constraint does not provide adequate information to decide which of the two lines should be reoriented without further context.

The modeling application 101 has a number of primitive model objects built in. For example the modeling application 101 has model objects for points, lines, curves, arcs, splines, planes, edges, and faces. These are the basic two-dimensional and three-dimensional primitives for more complex modeling needs. The modeling application 101 supports a number of built-in operations on model objects such as extrude, revolve, union, difference, intersection, fillet, shell and draft that can be used to model other shapes. A variety of constraints are supported by the modeling application 101 on the model objects. Two or more model objects can be constrained geometrically in a number of ways. For example, the constraints built in to the modeling application 101 might include constraints that require the model objects to be parallel, perpendicular, a certain distance apart, aligned at the midpoints, collinear, coincident, horizontal, vertical, at a specific angle to one another, a certain distance from a plane, etc. At any time, the user can request that the constraints be satisfied, or solved, by the computer.

These primitive model objects that are built-in to the modeling application 101 are not satisfactory building blocks for more complex models. For example, if the user were designing a skyscraper with the modeling application 101, it would be unsatisfactory for the user to tediously design each steel I-beam from the primitive model objects. Rather, it is desirable to build the skyscraper using I-beams as the basic building block, or primitive, for the skyscraper. The modeling application 101 permits the user to define her or his own reusable design components. The reusable design components are also called design fragments.

Any portion of a model can become a reusable design component. The design fragment might be a parameterized feature or a portion of a complete solid, such as a cutout or a knob. It might be a complete solid or a part. It might also be an assembly. Alternatively, it could be some combination, such as a set of mating features for adjoining parts of an assembly.

For example, in the model 175 that depicts a kitchen, the user can create a reusable design component out of the island. The user signals, using the input device 102, that she or he desires to create a reusable design component. The model objects from the model 175 that are to be part of the reusable design component are then identified. The modeling application 101 then determines the inputs and outputs from the design fragment 185. The user can then provide default values for the inputs to the design fragment 185 as well as provide limits on the range of values those inputs can assume.

For example, the design fragment 185 for the island might have height, width, depth, and countertop material type inputs. The height, width, and depth inputs would determine the exterior dimensions of the island cabinet. The countertop material type input might be used to compute the weight of the island. The design fragment 185 might have an output indicating the weight of the finished island. Other properties of the design fragment 185 can be driven by the input values. For example, most cabinets have a toe kick. The dimensions and positioning of the toe kick can be completely defined in terms of the input values.

Once the user has provided the default input values and defined how the inputs drive the design fragment 185, the design fragment data 180 is stored in the memory 106 by the modeling application 101. The design fragment data 180 comprises all of the information necessary to reuse the design fragment in another model. Once the design fragment 185 is packaged for use, users can only work with the design fragment 185 through the defined inputs and outputs.

Once a reusable design component has been created it can be used in other models. Thus, if the user is designing another kitchen and the user wants to build another island, the user does not need to start from scratch. The user simply signals to the modeling application 101 to provide a list of the available reusable design components. The modeling application 101 can build this list from design fragments stored in the memory 106 or from design fragments available via the network connection 104. In this example, the design fragment data 180 includes a title indicating "Kitchen Island" and the user signals that she or he wants to use that design fragment. While selecting design fragments, the modeling application 101 can use the default input values stored with the design fragments to show a sketch of the design fragment to the user.

Once selected, a single model object for the selected design fragment is added to the model data 170. This model object corresponds to the design fragment 185 created with the default values in the model 175. The user can now freely position the design fragment 185 in the model 175 using the input device 102. The user can also adjust the inputs, or parameters, that define the design fragment. The user can apply constraints to the design fragment 185. Any operations or interactions that the user could have with other model objects can be done to the design fragment 185. However, the user cannot access the underlying model objects comprising the design fragment 185. That is because the modeling application 101 protects the interface between the design fragment 185 and the model 175. This has the effect of preventing the user from misusing or corrupting the structure of the reusable design component. This also protects the proprietary information that belongs to the creator of the reusable design component.

In order to ensure that design fragments are not misused, the modeling application 101 imposes restrictions on the types of constraints that can be applied between a design fragment and a model object. Either directed or non-directed constraints can be used to define the input values of a design fragment. However, the constraints relating the external model with output values are treated as directed constraints, with the output values being considered fixed. Similarly, the constraints between the input values and the internal components of the design fragment are considered to be directed constraints, with the inputs being fixed.

For example, if the design fragment does not create a toe kick appropriate for the local building code, the user cannot modify the manner in which the inputs drive the creation of the toe kick. The user cannot access the underlying model object primitives to move the position of the toe kick because in the model 175, the design fragment 185 is a single model object that is indivisible. However, the user can attach non-directed constraints to the edge of the toe kick to position it next to, or in line with, other model objects. The user can use the output values from the design fragment 185 to drive other computations. In this instance, the weight output might be used to compute the type of tile to use for the kitchen. This object-oriented packaging of reusable design components is a feature of the invention.

Unlike other reusable design approaches, the modeling application 101 is able to handle the design fragment 185 without any user programming. This is because the design fragment 185 is composed of primitive model objects and other design fragments, which are in turn composed of primitive model objects. Thus, the users with problem domain specific knowledge are able to design reusable components without programming knowledge. The ease with which reusable design components can be created along with the protections offered will increase the number of reusable design components created because expensive, time-consuming, and specialized programming is no longer necessary.

Each use of the reusable design component in the model 175 only adds a single additional model object to the model data 170. This ensures that the model data 170 remains a manageable size. This also provides a useful level of information hiding. For example, the model data 170 for a structure built with an I-beam reusable design component will comprise many I-beam model objects but no model objects for the extrusions, fillets, and rounds that make up the I-beams. Thus, when working on a building design, the list of model objects will be comprised solely of components of the building rather than model objects that form the steel I-beams.

It is important to note that each reusable design component is capable of being constrained by any appropriate constraints, including those provided by the user or other third parties, available in the modeling application 101. One method for solving the model 175 that includes reusable design components such as the design fragment 185 is to use the graph based approach developed by Scott M. Borduin. The constraint satisfaction process is complicated by the fact that constraints that are internal to the reusable design component must be maintained irrespective of attempts to constrain the reusable design component to a model object in a fashion that would be inconsistent with those internal constraints.

B. Creating Reusable Design Components

Figure 2:
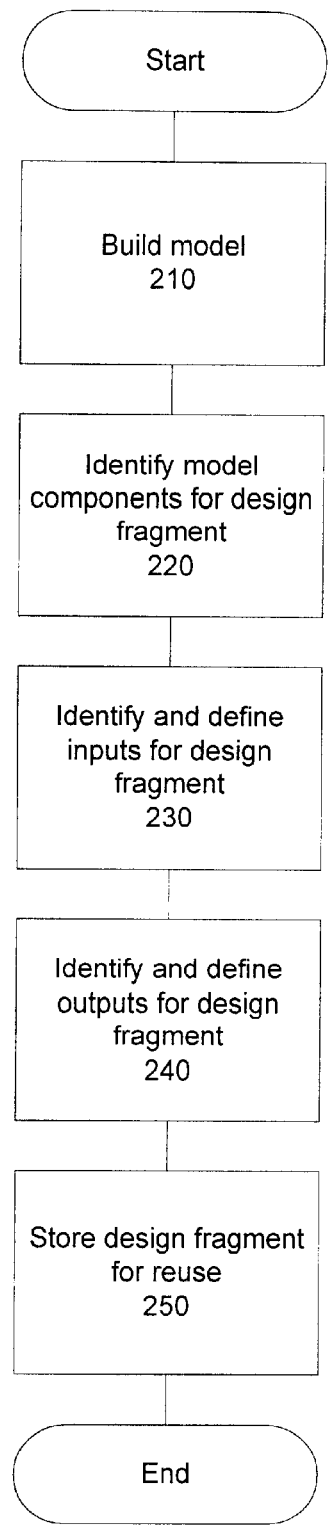
FIG. 2 illustrates one embodiment of a method of creating a reusable design component.

FIG. 2 describes one method for creating reusable design components.

At step 210, a user builds a model. The model can comprise any primitive model objects that are built in to the modeling application as well as complex model objects such as previously created reusable design components. The model need not contain any model objects other than the components that will make up the reusable design object being created. For example, if a user wanted to create a steel I-beam design object, the user could simply start building a model that comprised a steel I-beam. Alternatively, the user could open a model that comprised a steel frame with several steel I-beams already in place.

Next, at step 220, the user identifies those model objects that are to become part of the reusable design component. A variety of input methods are appropriate for receiving the user's signals. For example, the mouse could be used to highlight the desired model objects in the model window or the user could select the desired model objects from the list of model objects in the model data.

At step 230, the modeling application then identifies dependencies between the selected model objects and the rest of the model. Those dependencies that drive the definition of the selected model objects become inputs states for the reusable design fragment. At this stage, the user can also provide default values for the inputs as well as provide minimum and maximum values if appropriate. In the example of a steel I-beam, the length of the beam and bending section modulus might be two inputs. At this stage, the user can use domain specific knowledge. For example, manufacturing and commercial restrictions can be used to limit the acceptable values for the input states.

The user must describe the relationship between the inputs and the dimensions of the component model objects. For example, a length input to the I-beam would normally change the length of a single edge of a single identified model object. This is an example of the user creating a direct relationship between an input and the definition of a model object. The coherency, appropriate shape, of the I-beam is then created by constraining the identified model objects to one another. Only when constraints are added between the identified model objects can the remaining edges then become the appropriate size. Similarly, because bending section modulus is an input state, some function must be provided that transforms the bending section modulus into appropriate dimensions for some of the identified model objects. This is an example of the user creating a relationship between an input and the definition of model objects using a formula. Constraints between the identified model objects will then ensure that the I-beam remains coherent. Thus, depending on how the user constructs the I-beam out of model objects, the exact relationships coupling the input states and the underlying model objects may vary.

Next, at step 240, the modeling application identifies the outputs from the selected model objects. Additionally, the user can define outputs from the reusable design component. For example, the flange width of the beam and other physical characteristics might be outputs. Again, the user is able to provide domain specific knowledge to improve the usefulness of the reusable design object. For example, if length, height, and bending section modulus are inputs, then the width and cross sectional area of the beam might be outputs.

Finally, the user signals that the design fragment should be packaged and stored for reuse as a reusable design component at step 250. At this stage, the model objects comprising the design fragment and the input and output states are packaged up and stored in the computer memory or in some computer readable media. Once stored as a reusable design component, users other than the creator normally will not access the underlying model objects. When the reusable design component is added to the user's model, only a single model object (i.e., an instance of the design fragment) is added to the corresponding model as an indivisible entity. During the constraint solution process lower level solid topology and geometry objects comprising the design fragment may be generated and cached by the modeling application. However, these lower level objects never become first class components of the user's model. The lower level objects can only be referenced as subsidiary components of a particular instance of a fragment.

C. Using Reusable Design Components

Figure 3:
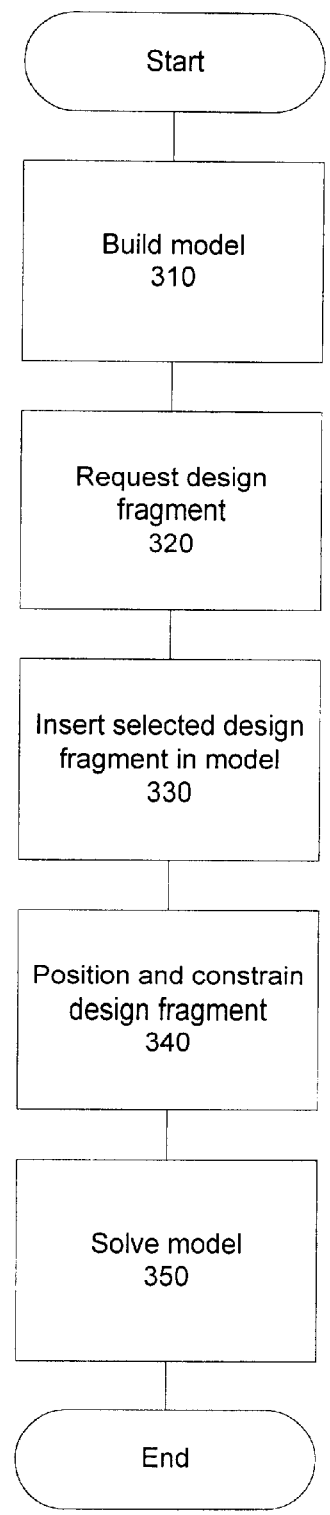
FIG. 3 illustrates one embodiment of a method of including a reusable design component in a model.

FIG. 3 describes one method for using reusable design components.

At step 310, the user begins by building a model. Once some reusable design components have been created or are made available on the user's computer or over the network, users can incorporate them into the models they are constructing.

At step 320, the user signals a request for a reusable design component. The modeling application can present the available reusable design components as a list. If the reusable design component has default input values, the modeling application can provide a default representation of the reusable design component.

Next at step 330, the selected reusable design component is inserted into the user's model. A single new model object is added to the model data. The new model object is a design fragment created from the design fragment data.

Next at step 340, the user can position and constrain the design fragment in her or his model. The input states to the design fragment can be explicitly provided or may be driven based on constraints between the design fragment and the model. The output states of the design fragment can be used to constrain the definition of other model objects.

The user can continue to build her or his model at step 310 or request that the constraints in the model be solved at step 350. The constraint satisfaction process is extremely complicated because the user is capable of applying directed and non-directed constraints to the design fragment, but the user is not capable of altering the internal constraints on the design fragment. The non-directed constraints from the outputs are treated as if they were directed, since the design fragment is solved internally in isolation of those constraints. Then, the outputs are treated as if they are fixed when the constraints are considered in the context of the model as a whole.

If, for example, the user requested that the web face, vertical edge, of the I-beam be constrained to be adjacent to a plane, this is treated as a directed constraint that can only be solved by moving the adjacent plane, or the entire I-beam and whatever it is connect to as a rigid body. If solving the constraint would require changing the shape of the I-beam section or bending or twisting the I-beam along the length, that would violate the internal constraints on the shape of the I-beam. However, if the user requested that both end faces of the I-beam mate to other parallel planes in the model, that would just cause the input length parameter to be defined by the distance between those planes. These non-directed constraints would be solved to define the input length parameter, which would then be used in a directed fashion to drive the solution of constraints that relate the design fragment inputs to the internal model objects that comprise the design fragment.

D. Alternative Embodiments

In one embodiment, cryptographic techniques can be used to prevent users other than the creator of a design fragment from using the modeling application to alter the design fragment.

E. Conclusion

Thus, a method and apparatus for creating reusable design components has been described. The method permits easy creation of reusable design components without programming by the people with problem domain specific knowledge. The method permits reusable design components to easily be constrained to other model objects by the end-user. The method permits reusable design components to have multiple input and output parameters defined by the creator of the component that act as an interface to the component for the end-user.

The foregoing description of a preferred embodiment of the invention has been presented for purposes of illustration and description. It is not intended to limit the invention to the precise forms disclosed. Obviously many modifications and equivalent arrangements will be apparent to practitioners skilled in this art. Therefore, persons of ordinary skill in this field are to understand that all such equivalent structures are to be included within the scope of the following claims and their legal equivalents.

What is claimed is:

1. A method of providing a reusable model of a three-dimensional object for use in modeling three-dimensional objects comprising the following steps:

selecting a set of model objects defining a structure of the reusable model, the set of model objects allowing a first set of external nondirected constraints, including a perpendicular constraint, a parallel constraint, an adjacency constraint, a plane to plane distance constraint, a line to line distance constraint, a point to plain distance constraint, a linear equation constraint, and a concentric constraint, which define a relationship to be solved by a solver program to position the reusable model in a model using the reusable model;

establishing a set of internal constraints to maintain the structure of the reusable model;

receiving a set of inputs for allowing a first set of external directed constraints, including a transformer constraint, a solver constraint, a chronological constraint, a copier constraint, a feature constraint, a component constraint, and a sketch plan constraint, which define a relationship to be solved by the solver program to position and define the structure of the reusable model in a model using the reusable model, and a second external non-directed constraint to be used as an input to the reusable model that defines a relationship to be solved by the solver program that positions and defines the structure of the reusable model and a structure of the model using the reusable model; and generating a set of outputs for providing outputs that includes a point, a line and a plane, to a second external directed constraint associated with the reusable model that defines a relationship to be solved by the solver program to define the structure of the model using the reusable model based on the structure of the reusable model.

2. The method of claim 1 wherein the first external nondirected constraint defines a relationship to be solved by a solver program to position the reusable model in a model using the reusable model.

3. The method of claim 1 wherein the set of internal constraints includes directed and nondirected constraints that define relationships to be solved by a solver program to maintain the coherency of the reusable model with respect to the three-dimensional object.

4. The method of claim 1 wherein the internal constraints include geometric constraints between the model objects of the reusable model.

5. The method of claim 1 wherein the internal constraints define parameters to mathematical formulae that define the structure of the reusable model.

6. The method of claim 1 wherein at least one input of the set of inputs has a predefined set of acceptable values and the reusable model for causing a solver program to signal an error when satisfying either the first external directed constraint or the second external nondirected constraint would require setting the at least one input to a value not in the predefined set of acceptable values.

7. The method of claim 1 wherein a default value is provided for at least one of the inputs, the default value defining the structure of the reusable model until it is constrained in a model using the reusable model.

8. The method of claim 1 wherein the reusable model is of a steel I-beam and the set of inputs includes a length input, a height input and a bending moment capacity input.

9. A computer-aided design system for creating reusable design components for use in modeling three-dimensional objects, the system comprising:
   a computer processor connected to a memory storage with a modeling application for defining a set of model objects that define the structure of a reusable design component, the set of model objects allowing a first set of external nondirected constraints to be associated with the reusable design component, including a transformer constraint, a solver constraint, a chronological constraint, a copier constraint, a feature constraint, a component constraint, and a sketch plan constraint, which define a relationship to be solved by the solver program to position the reusable model in a model using the reusable model, and wherein the computer processor is directed by the modeling application:
   to define a set of internal constraints to maintain the structure of the reusable design component;
   to define a set of inputs for allowing a first set of external directed constraints, including a transformer constraint, a solver constraint, a chronological constraint, a copier constraint, a feature constraint, a component constraint, and a sketch plan constraint, which define a relationship to be solved by the solver program to position and define the of the reusable model in a model using the reusable model, and a second external nondirected constraint to be used as an input to the reusable design component that defines a relationship to be solved by the solver program that positions and defines the structure of the reusable model and a structure of the model using the reusable model; and
   to define a set of outputs for providing outputs to a second external directed constraint associated with the reusable design component that defines a relationship to be solved by the solver program to define the structure of the model using the reusable model based on the structure of the reusable model.

10. The system of claim 9 wherein the system includes a means for defining a two-dimensional image of the reusable design component with a set of predefined inputs.

11. The system of claim 9 wherein the system includes a means for defining a set of predefined values for at least one input of the set of inputs.

12. The system of claim 9 wherein the system includes a means for defining a default value for at least one input of the set of inputs.

* * * * *